United States Patent [19]

Tokunori et al.

[11] Patent Number: 4,994,848
[45] Date of Patent: Feb. 19, 1991

[54] IMAGING DEVICE

[75] Inventors: Katoh Tokunori; Sakakibara Kenji, both of Ichinomiya; Akao Michitoshi, Nagoya; Sawaki Yukichi, Gifu; Sonoda Takakuni, Nagoya, all of Japan

[73] Assignee: Brother Kogyo Kabushiki Kaisha, Japan

[21] Appl. No.: 361,142

[22] Filed: Jun. 5, 1989

[30] Foreign Application Priority Data

Jun. 6, 1988 [JP] Japan .............................. 63-74877[U]

[51] Int. Cl.⁵ ............................................. G03B 27/32
[52] U.S. Cl. ..................................................... 355/27
[58] Field of Search .................. 355/27, 28, 282, 285, 355/290, 295; 354/21; 100/158 R, 160, 168, 156; 430/138

[56] References Cited

U.S. PATENT DOCUMENTS 4,437,742  3/1984  Taniguchi ........................... 354/21
4,464,985  8/1984  Asanuma et al. .................... 100/47

Primary Examiner—A. A. Mathews
Assistant Examiner—Khanh Dang
Attorney, Agent, or Firm—Kane, Dalsimer, Sullivan, Kurucz, Levy, Eisele and Richard

[57] ABSTRACT

In an imaging device for forming a visible image on a recording medium by pressurizing the recording medium, provided are means for detecting a certain position of the recording medium to be pressurized before the recording medium is pressurized, and means for controlling timing of beginning and stopping to pressurize the recording medium based upon a result of the detecting operation.

Thus, the recording medium is accurately begun to pressurize at the leading end and stopped to pressurize at the trailing end regardless of a variation of a travelling speed for the recording medium.

15 Claims, 3 Drawing Sheets

IMAGING DEVICE

BACKGROUND OF THE INVENTION

This invention relates to an imaging device employing so-called transfer type pressure-sensitized recording medium consisting of a microcapsule sheet (pressure-sensitized medium) and a developing sheet or a self-developing type pressure-sensitized recording medium, more particulary, to an imaging device having a function capable of controlling an operation of a pressurizing rollers for pressurizing medium so as to begin to accurately pressurize the recording medium from the start position of an area to be pressurized.

An imaging device employing a pressure-sensitized recording medium consisting of a microcapsule sheet and a developing sheet will be described below for an example of conventional devices.

The microcapsule sheet forms a roll with its leading end to be pulled out of it in operation. The developing sheet is in cut form.

Such an imaging device generates through exposure a latent image responsive to the actual image on the microcapsule sheet. A developing sheet is then laid on the side carrying the latent image of the microcapsule sheet and both are pressurized between a pair of pressure rollers opposed to each other. This pressure operation develops the latent image formed on the microcapsule sheet into a visible image transferred to the developing sheet.

The pair of pressure rollers are normally in their standby open position, while drawing themselves to a closed position when a sensor, for instance, detects the developing paper passing a certain position having been set before the pair of the pressure rollers. The pressure rollers resume their open position when they are rotated through a certain angle after closure thereof.

However, there are some cases in which adjusting the degree of exposure of the pressure-sensitized recording medium or enlarging or reducing the image size is effected by varying a travelling speed of the pressure-sensitized recording medium. As the travelling speed thus varies, there is some irregularity in feed quantity of the developing medium and the pressure-sensitized recording medium into the space between the pressure rollers when the opposing pressure rollers of the pressure developing unit are completely brought to their closing position.

This makes the pressure-developing operation on the developing sheet start at varying start positions, resulting in a difficulty in providing an exact reproduction of the image.

Also, when employing a pressure-sensitized recording medium consisting of microcapsule sheet and developing sheet, a problem has been encountered that, if a sheet of microcapsule sheet with no developing sheet laid on it is put under pressure, the content of the microcapsules is deposited on the rollers staining the back of the developing sheet at the time of following development. Furthermore, a thickened layer of capsule content laid upon the roller surface makes pressure distribution over the pair of pressure rollers less uniform, so that the developed image suffers uneven color quality.

SUMMARY OF THE INVENTION

It is therefore an object of the invention to provide an improved imaging device having a function capable of setting the timing of opening and closing the pair of pressure rollers in optimum state.

For this purpose, according to this invention, there is provided an imaging device employing a continuous-form recording sheet coated with a plurality of photo and pressure sensitive microcapsules and a cut-sheet type developing sheet being superposed on said recording sheet to develop a visible image thereon, said imaging device comprising:

exposure means for exposing a latent image on said recording sheet;

a pair of pressure-developing rollers, adapted to be brought into and out of contact with each other, for pressurizing said recording sheet and said developing sheet to develop a visible image on said developing sheet;

feed means for feeding said recording sheet and said developing sheet toward said pair of rollers; and control means including a detector for detecting a passing of a leading end of said developing sheet before said developing sheet is pressurized and for controlling said pair of rollers so as to be brought into contact with each other after the leading end is fed into a space between said pair of rollers by said feed means.

DESCRIPTION OF THE ACCOMPANYING DRAWINGS

DESCRIPTION OF THE EMBODIMENT

The present invention is now described in more particular with reference to a preferred embodiment.

Figure 2:
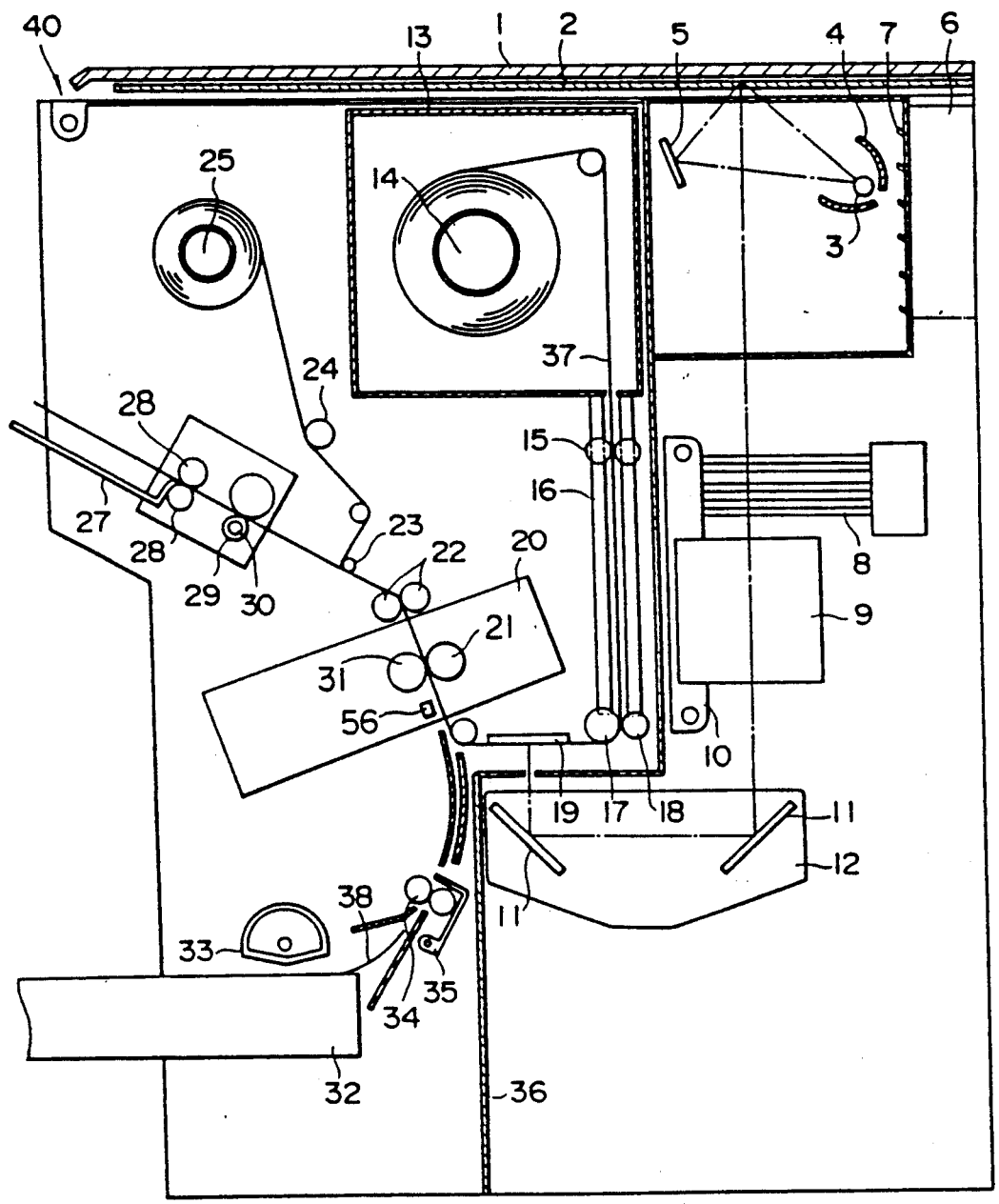
FIG. 2 is a view showing the configuration of the imaging device according to the invention.

FIG. 2 is a schematic sectional view of a photo- and pressure-sensitive duplicating machine capable of full-color copying. A sensitized sheet implementing such copying (consisting of paper coated with microcapsules and developing paper) has been proposed in Japanese Patent Provisional Publication Sho No. 58-88739.

The photo- and pressure-sensitive duplicating machine 40 includes, as shown, a glass original tray 2 whose top panel is reciprocally movable rightward and leftward and an original tray cover 1. A desired original can be placed on the glass original tray 2 up side down. Secured to the upper right portion of the machine 40 is a light source unit consisting of a halogen lamp 3 extending perpendicularly to the reciprocal movement of the glass original tray 2 and a semi-cylindrical reflection mirror 4 located to surround the lamp 3, so that it shines the glass original tray 2 with linear beams of light.

As the glass original tray 2 is reciprocated, the light beams emitted from the halogen lamp 3 are thus allowed to shine the entire surface of the glass panel from its left end to right. The light beams emitted from the light source are passed through the glass original tray 2 and reflected on the original placed on it. In order to confine the reflection light to the area of the original, the original tray cover 1 is provided over the top surface of the glass original tray 2.

Furthermore, in order to use the light emitted from the halogen lamp 3 for shining the original with a higher efficiency, there is a reflector 5 located to the left of the light source so that the light beams that have not reached the original are again reflected there to shine on the original.

A fan 6 and a louver 7 are provided to the right of the halogen lamp 3 to intake air from outside. This allows the glass original tray 2 to be ventilated well. The light beams emitted from the halogen lamp 3 and reflected from the original placed on the glass original tray 2 are passed through a filter 8 to a lens 9. The filter 8 is provided to change the light transmitting characteristics in dependence on the sensitivity of the microcapsule sheet 37 so as to adjust a tonality of the duplicated image. The lens 9 is mounted on the lens mount plate 10 with a possibility of fine angle adjustment with respect to the optical path. Furthermore, the lens 9 is vertically movable so that it is moved up and down by means of a lens moving unit 51 shown in FIG. 1. The light beams converged by the lens 9 are turned through an angle of 180 degrees by means of two reflection mirrors 11, 11 and form an image on the microcapsule sheet 37 in close contact with the down side of an exposure tray 19. The two reflection mirrors 11, 11 are fixedly mounted on a mirror mount plate 12 so that adjustment of the length of optical path and focusing takes place by fine adjustment of the mounting position of the mirror mount plate 12.

The microcapsule sheet 37 in continuous form is wrapped around a cartridge shaft 14 which is housed in a detachable cartridge 13 located under the glass original tray 2. One end of the sheet 37 reaches a take-up shaft 25 by way of multiple rollers and a pressure-developing unit 20.

The microcapsule sheet 37 coming from the underside of the cartridge 13 is guided along the under face of the exposure tray 19 by means of feed rollers 15 and a guide roller 17 and fed to the pressure-developing unit 20. The microcapsule sheet 37 passed through the pressure-developing unit 20 is then sent to a separation roller 23 and a winding run adjustment roller 24 and is taken up onto the take-up shaft 25. The unexposed microcapsule sheet 37 leaving the cartridge 13 is protected against light by means of a shield cover 16.

Figure 1:
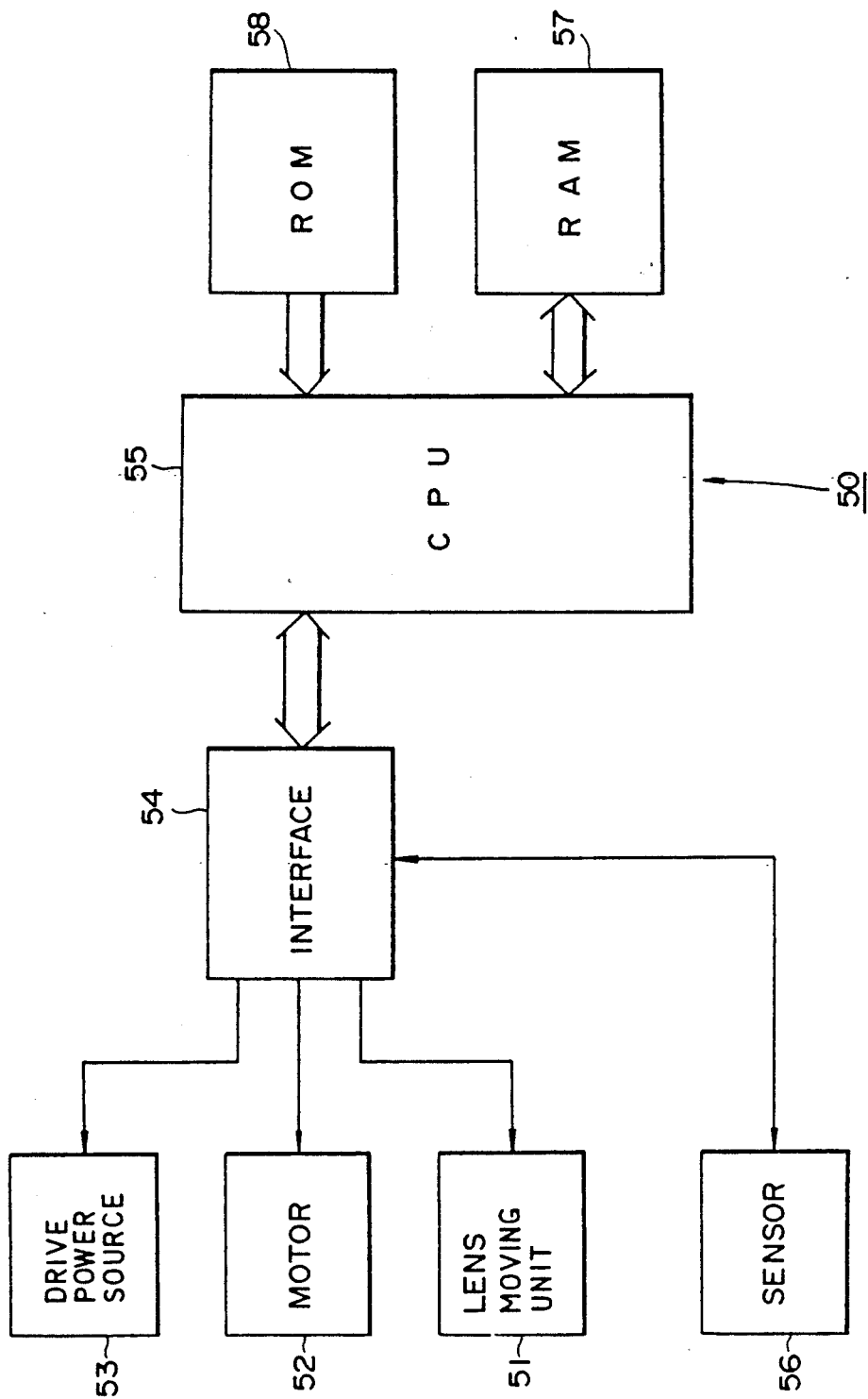
FIG. 1 is a view showing the configuration of the control unit for controlling the pair of pressure rollers of the imaging device according to the invention.

The travelling speed of microcapsule sheet 37 is controlled by a sheet feed rollers 22, 22 connected to a motor 52 shown in FIG. 1 and is varied in dependence on the reciprocal speed of the glass original tray 2 and the magnification factor. Accordingly, the latent image of a certain line on the text is built one by one on the microcapsule sheet 37 while it is passed through the exposure tray 19.

Below the pressure-developing unit 20 located is a developing sheet cassette 32 accommodating developing sheet 38 in cut form. The developing sheet 38 is picked out one by one by means of a semi-cylindrical roller 33 and is at its end registered by means of developing sheet rollers 34 and a registration gate 35 to be brought to the paper inlet of the pressure-developing unit 20.

Consequently, the microcapsule sheet 37 and the developing sheet 38 in close contact with each other are together sent to the pressure-developing unit 20. The pressure-developing unit 20 consists of a first pressure roller 21 and a second pressure roller 31. The two sheets of paper are thus pinched and pressed between the first pressure roller 21 and the second pressure roller 31, with the inside surface of the microcapsule sheet 37 on which the latent image is built in contact with the inside surface of the developing sheet 38 which is coated with a developing material. With this pressure, the microcapsules remaining unexposed are crushed to develop an image on the developing sheet 38.

The microcapsule sheet 37 and the developing sheet 38 leaving the pressure-developing unit 20 are then conveyed by means of the capsule sheet feed rollers 22. The microcapsule sheet 37 and the developing sheet 38 are then separated from each other by the separation roller 23, the former going in upward direction and the latter forward. On the developing sheet 38, colors are developed by means of a heat setting unit eventually forming a visible image. The paper is then discharged to a paper outlet tray 27 with the image-carrying side facing up. The heat setting unit consists of a hollow heat roller 29 accommodating a heater 30 and a developing sheet feed rollers 28, 28.

The microcapsule sheet 37 separated is now taken up around the take-up shaft 25 by way of the winding run adjustment roller 24.

The arrangement as described above is operated as to be described below.

When the start button (not shown) is pressed down after opening the original tray cover 1 and placing an original on the glass original tray 2, the latter is moved rightward of FIG. 2 and is brought to a stop at a position where the left end of the glass original tray 2 is placed opposite to the light source. Thereafter, the text tray 2 is moved to left, with the halogen lamp 3 kept illuminated. The light emitted from the halogen lamp 3 is reflected on the original and further on the filter 8, lens 9 and two reflection mirrors 11, 11 and forms an image on the microcapsule sheet 37 placed under the exposure tray 19. At this time, the microcapsule sheet 37 is moved to left on the exposure tray 19 at the same speed as the reciprocation speed of the glass original tray 2, so that a latent image of the picture on the original is formed on the microcapsule sheet 37.

With the leftward movement of the glass original tray 2, the developing sheet 38 is picked up by the semi-cylindrical roller 33 from the developing sheet cassette 32 and is laid upon the exposed microcapsule sheet 37 to be together fed to the pressure-developing unit 20.

The developing sheet 38 is then thermally set by the heat setting unit and is discharged from the duplicating machine 40. On the other hand, the microcapsule sheet 37 passed through the pressure-developing unit 20 is continuously taken up onto the take-up shaft 25. When the glass original tray 2 is brought to a position in which its right end opposes to the light source, duplication of the original text is completed to turn off the halogen lamp 3.

Figure 3:
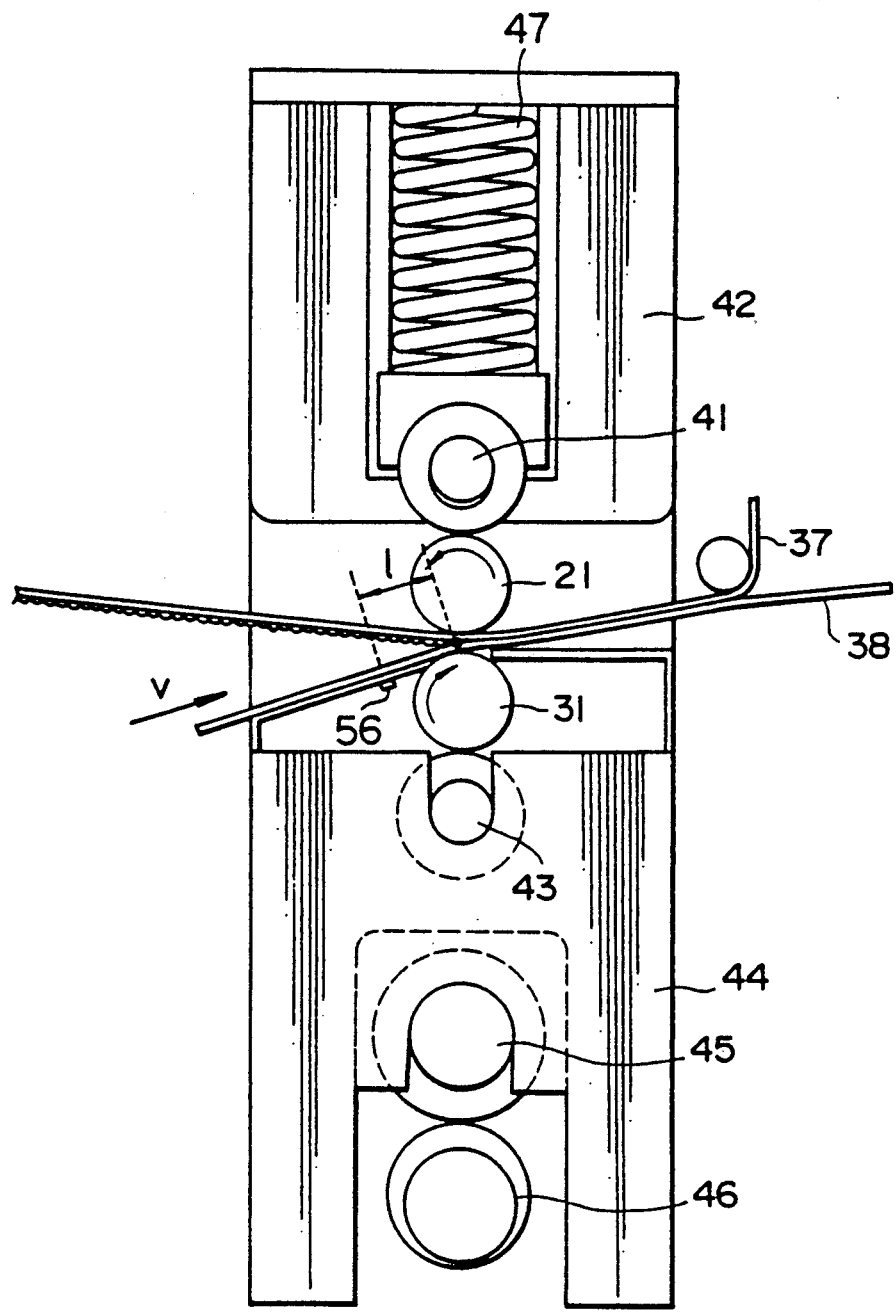
FIG. 3 is a view showing a one embodiment of a pressure developing unit incorporated in the imaging device according to the invention.

The pressure developing unit 20 as mentioned above will be described below. FIG. 3 is a sectional view showing a pressure developing unit embodying the present invention. There are the first pressure roller 21 and the second pressure roller 31 placed in opposition to each other, between which the microcapsule sheet 37 and the developing sheet 38 laid upon each other are passed. The first pressure roller 21 is movably mounted on a first frame 42 together with a first backup roller 41. The second pressure roller 31 is likewise movably mounted on a second frame 44 together with a second backup roller 43. The second frame 44 itself is configured to be movable relative to the first frame 42. Referring to its mechanism, a cam shaft 46 having a shape of eccentric cam for a frame lift roller 45 is driven by a drive power source 53 shown in FIG. 1, so that the frame lift roller 45 is rotated along the cam contour. As the cam shaft 46 is rotated, the cam lobe reaches the position for contact with the frame lift roller 45, whereupon the second frame 44 and therefore the second pressure roller 31 are moved toward the first frame 42. Since the first pressure roller 21 is here loaded by a pressure spring 47 via the first backup roller 41, the first pressure roller 21 and the second pressure roller 31 are in pressure contact with each other under the pressure force of the pressure spring 47.

When, on the other hand, the lowered portion of the cam comes into contact with the frame lift roller 45, the second frame 44 is moved apart from the first frame 42, whereby the second pressure roller 31 comes out of pressure contact with the first pressure roller 21 generating a space to receive the developing sheet 38.

Now described below is a drive power source 53 for rotating the cam shaft 46 and a control unit 50 for it.

The drive power source 53 is electrically cconnected to a well-known CPU (Central Processing Unit) 55 via an interface circuit 54, which is in turn connected to a sensor 56. The sensor 56 is located at a position before the first pressure roller 21 and the second roller 31 and detects paper when the leading or trailing end of the developing sheet 38 passes the position at which the sensor 56 is located. The sensor 56 is usually reflection type photo sensor monitoring a reflection factor of the travelled sheet, and detecting a leading or trailing end of the developing sheet 38 by sensing a difference of the reflection facotrs of the microcapsule sheet 37 and the developing sheet 38. The interface circuit 54 is further connected with a lens moving unit 51 and a motor 52. The CPU 55 controls the lens moving unit 51 and the motor 52 to effect exposure with a desired magnification. The CPU 55 has further connected therewith a RAM (Random Access Memory) 57 as work area of the CPU 55 and a ROM (Read Only Memory) 58 describing the procedure of the CPU 55.

Explanation is now given to the timing of opening and closing the first and second pressure rollers 21 and 31 of the pressure developing unit 20 configured as described above.

When exposure is finished, the microcapsule sheet 37 and the developing sheet 38 laid upon each other are fed together. The travelling speed of them is determined by the CPU 55 in dependence on a magnification given by a position of the lens 9. The CPU 55 then controls the motor 52 in response to the travelling speed given, to thereby rotate the sheet feed rollers 22, 22. When the sensor 56 provided in the feed path detects the leading end of the developing sheet 38 passing the sensor 56, the drive power source 53 is controlled to rotate the cam shaft 46 by half a turn, after the time Ts given by the following equation elapses, thus closing the first and second rollers 21 and 31

$$Ts \geq (l/v) - Ti$$

where,
l: distance between the sensor 56 and a contact point between the first and second rollers 21 and 31,
v: travelling speed,
$T\omega$: a time (cycle) required for one turn of the cam shaft which is rotatably driven by the drive power source 53.
$T_i$ = the time required for the pair of rollers having been brought out of contact to be brought into contact With this arrangement, the first and second pressure rollers 21 and 31 are brought into pressure contact with each other, simultaneously the leading end of the developing paper 38 reaches the pressure contact point.

When the trailing end of the developing 38 now passes the sensor 56, the CPU 55 causes the drive power source 53 to rotate by half a turn after the time To given by the following equation elapses from that timepoint, to thereby open the first and second pressure rollers 21 and 31.

$$To \leq l/v$$

With this arrangement, the first and second pressure rollers 21, 31 are brought to an open position simultaneously as the trailing end of the developing sheet 38 reaches the pressure contact point.

While in this embodiment, Ts and To are calculated after development, there will be no need of occasional calculation if the values of Ts and To calculated with respect to every possible travelling speed "v" are stored in the ROM 58 in advance.

Also, the first and second rollers 21 and 31 can be brought to a closed position in the following manner. Assuming that the travelling speed is "v" as mentioned above, the CPU 55 controls the drive power source 53 simultaneously as the sheet passes the sensor 56, to thereby rotate the cam shaft 46 at an angular velocity defined by the following equation.

$$\psi \leq (180°).v/l(deg/sec) \text{ or}$$

$$\psi \leq \pi rad.v/l(rad/sec)$$

With this arrangement, pressure development starts simultaneously as the leading end of the developing sheet 38 reaches the pressure contact point as in the embodiment described.

It is obvious that many other modifications can be made to the present invention.

What is claimed is:

1. An imaging device employing a continuous-form recording sheet coated with a plurality of photo and pressure sensitive microcapsules and a cut-sheet type developing sheet being superposed on said recording sheet to develop a visible image thereon, said imaging device comprising:
    exposing means for exposing a latent image on said recording sheet;
    a pair of pressure-developing rollers, adapted to be brought into and out of contact with each other, for pressurizing said recording sheet and said developing sheet to develop a visible image on said developing sheet;
    feed means for feeding said recording sheet and said developing sheet in an overlapped state toward said pair of rollers; and
    controlling means including a detector for detecting at least a passing of a leading end of said developing sheet before said developing sheet is pressurized and for controlling said pair of rollers so as to be brought into contact after the detection of said developing sheet and in accordance with the feeding speed of the developing sheet as the developing sheet is fed into a space between said pair of rollers by said feed means.

2. The imaging device according to claim 1 wherein said controlling means controls said pair of rollers so as to be brought into contact when the time of period Ts defined by the following equation elapses after the passing of the leading end of the developing sheet is detected by said detector.

$$Ts \geq l/v - t_i (\text{sec.})$$

where,
- v: speed of the developing sheet in per second,
- l: distance from the detected point to the space between the pair of rollers, and
- $t_i$: the time required for the pair of rollers having been brought out of contact to be brought into contact with each other.

3. The imaging device according to claim 2 wherein one of said pair of rollers is mechanically connected to a cam shaft member having a shape of eccentric cam, said pair of rollers being adapted to be brought into contact in case the one of said pair of rollers is connected to the portion corresponding to a large radius portion of said cam shaft member while being adapted to be brought out of contact in case the one of said of rollers is connected to the portion corresponding to a small radius portion of said cam shaft member, and wherein said controlling means controls said cam shaft member so as to be begun to rotate in an angular velocity defined by the following equation when the passing of the leading end of the developing sheet is detected by said dector, $$\psi \leq \pi \text{rad.} \cdot v/l (\text{rad./sec.})$$

where,
- $\psi$: angular velocity of the cam shaft member to be rotated,
- v: feeding speed of the developing sheet in per second, and
- l: distance from the detected point to the space between the pair of rollers.

4. The imaging device according to claim 1 wherein said detector further detects a passing of a trailing end of the developing sheet and controlling means further controls said pair of rollers so as to be brought out of contact before the trailing end of the developing sheet is pressurized by said pair of rollers.

5. The imaging device according to claim 2 wherein said detector further detects a passing of a trailing end of the developing sheet, and said controlling means further controls said pair of rollers so as to be brought out of contact when the time of period To defined by the following equation elapses after the passing of the trailing end is detected, $$To \leq l/v (\text{sec.})$$

where,
- v: feeding speed of the developing sheet in per second, and
- l: distance from the detected point to the contact point of said pair of rollers.

6. The imaging device according to claim 3 wherein said detector further detects a passing of a trailing end of the developing sheet and wherein said controlling means controls said cam shaft member so as to be begun to rotate in an angular velocity defined by the following equation when the passing of the trailing end of the developing sheet is detected by said dector, $$\psi \leq \pi \text{rad.} \cdot v/l (\text{rad./sec.})$$

where,
- $\psi$: angular velocity of the cam shaft member to be rotated,
- v: feeding speed of the developing sheet in per second, and
- l: distance from the detected point to the contact point of said pair of rollers.

7. The imaging device according to claim 1 wherein said detector is reflection type photo sensor capable of detecting a difference between a reflection factor of the recording sheet and the developing sheet.

8. The imaging device in accordance with claim 1 wherein said controlling means comprises an interface unit connected to said detector and a controlling unit which includes a central processing unit (CPU) connected to said interface unit.

9. The imaging device in accordance with claim 8 further comprising a read only memory and a random access memory connected to said CPU.

10. The imaging device in accordance with claim 8 wherein said interface unit is further connected to a drive power source for driving said pair of pressure rollers into and out of contact with each other.

11. The imaging device in accordance with claim 8 wherein said exposing means includes magnification setting means for setting a magnification of a latent image formed on said continuous-form recording sheet and said interface unit is connected to said magnification setting means.

12. The imaging device in accordance with claim 8 wherein said feeding means includes a motor for feeding said continuous-form recording sheet and said interface unit is connected to said motor.

13. An imaging device employing a continuous-form recording sheet coated with a plurality of photo and pressure sensitive microcapsules and a cut-sheet type developing sheet being superposed on said recording sheet to develop a visible image thereon, said imaging device comprising:
- exposing means for exposing a latent image on said recording sheet;
- a pair of pressure-developing rollers, adapted to be brought into and out of contact with each other, for pressurizing said recording sheet and said developing sheet to develop a visible image on said developing sheet;
- feed means for feeding said recording sheet and said developing sheet in an overlapped state toward said pair of rollers; and
- controlling means including a detector for detecting at least a passing of a leading end of said developing sheet, an interface unit connected to said detector and a controlling unit having a central processing unit connected to said interface unit for controlling said pair of rollers to be brought into contact upon the detection of the developing sheet and in accordance with the feeding speed of the developing sheet after a desired portion of said developing sheet is fed into a space between said pair of rollers;
- a read only memory and a random access memory connected to said CPU;
- a drive power source connected to said interface unit for driving said pair of pressure rollers into and out of contact with each other;
- magnification setting means connected to said interface unit for setting a magnification of a latent image formed on said continuous-form recording sheet; and, a motor connected to said interface unit for feeding said continuous-form recording sheet.

14. An imaging device employing a continuous-form recording sheet coated with a plurality of photo and pressure sensitive microcapsules and a cut-sheet type developing sheet being superposed on said recording sheet to develop a visible image thereon, said imaging device comprising:

exposing means for exposing said continuous-form recording sheet to light to form a latent image;

a pair of pressure-developing rollers, adapted to be brought into and out of contact with each other, for pressurizing said recording sheet and said developing sheet to develop a visible image on said developing sheet;

feed means for feeding said recording sheet and said developing sheet toward said pair of rollers; and controlling means for controlling said pair of rollers so as to be brought into contact when a predetermined position of an area to be pressurized of said developing sheet is fed into a space between said pair of rollers by said feed means and to be brought out of contact when another predetermined position is fed into the space between said pair of rollers.

15. The imaging device according to claim 14 wherein said predetermined position comprises a leading edge of said developing sheet and said another predetermined position comprises a trailing edge of said developing sheet.

* * * * *